United States Patent
Mercado et al.

(10) Patent No.: US 6,646,347 B2
(45) Date of Patent: Nov. 11, 2003

(54) SEMICONDUCTOR POWER DEVICE AND METHOD OF FORMATION

(75) Inventors: Lei L. Mercado, Gilbert, AZ (US); Vijay Sarihan, Paradise Valley, AZ (US); Young Sir Chung, Chandler, AZ (US); James Jen-Ho Wang, Phoenix, AZ (US); Edward R. Prack, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/998,507

(22) Filed: Nov. 30, 2001

(65) Prior Publication Data

US 2003/0102563 A1 Jun. 5, 2003

(51) Int. Cl.$^7$ .......................... H01L 23/48; H01L 23/52
(52) U.S. Cl. ................... 257/751; 257/750; 257/762
(58) Field of Search .................. 257/762, 751, 257/741, 750, 757, 343; 438/687, 595

(56) References Cited

U.S. PATENT DOCUMENTS

| 5,744,843 A | | 4/1998 | Efland et al. |
|---|---|---|---|
| 6,066,877 A | | 5/2000 | Williams et al. |
| 6,093,966 A | * | 7/2000 | Venkatraman et al. ....... 257/751 |
| 6,140,702 A | | 10/2000 | Efland et al. |
| 6,150,722 A | * | 11/2000 | Efland et al. ................ 257/752 |

* cited by examiner

*Primary Examiner*—Stephen D. Meier
(74) *Attorney, Agent, or Firm*—Robert A. Rodriguez; Joseph P. Lally

(57) ABSTRACT

In accordance with one embodiment, a stress buffer (40) is formed between a power metal structure (90) and passivation layer (30). The stress buffer (40) reduces the effects of stress imparted upon the passivation layer (30) by the power metal structure (90). In accordance with an alternative embodiment, a power metal structure (130A) is partitioned into segments (1091), whereby electrical continuity is maintained between the segments (1090) by remaining portions of a seed layer (1052) and adhesion/barrier layer (1050). The individual segments (1090) impart a lower peak stress than a comparably sized continuous power metal structure (9).

10 Claims, 5 Drawing Sheets

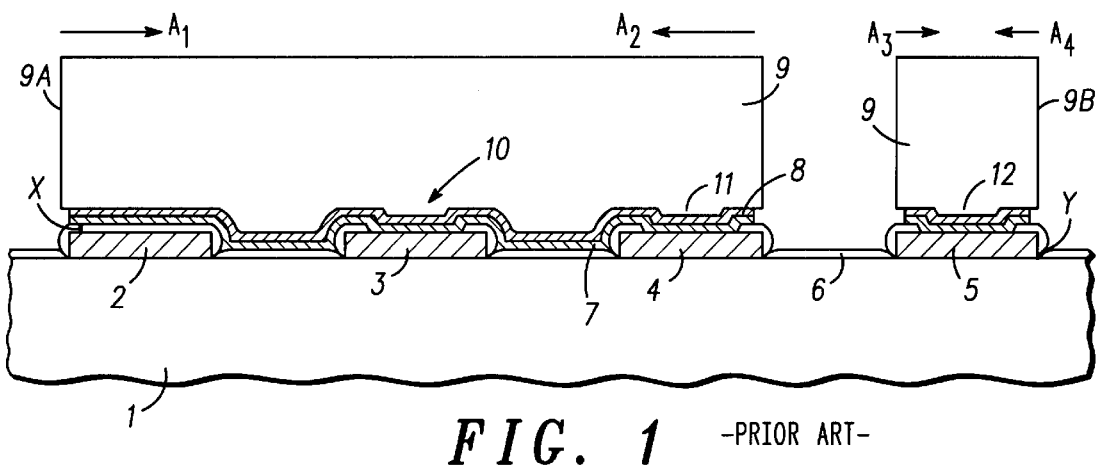
FIG. 1 —PRIOR ART—
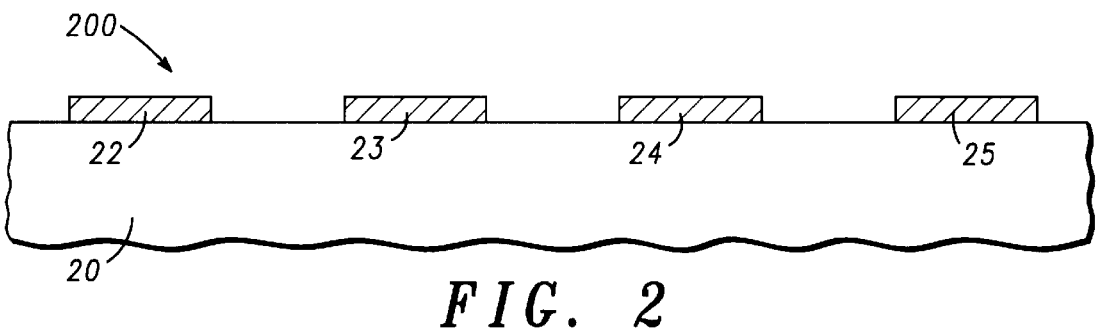
FIG. 2
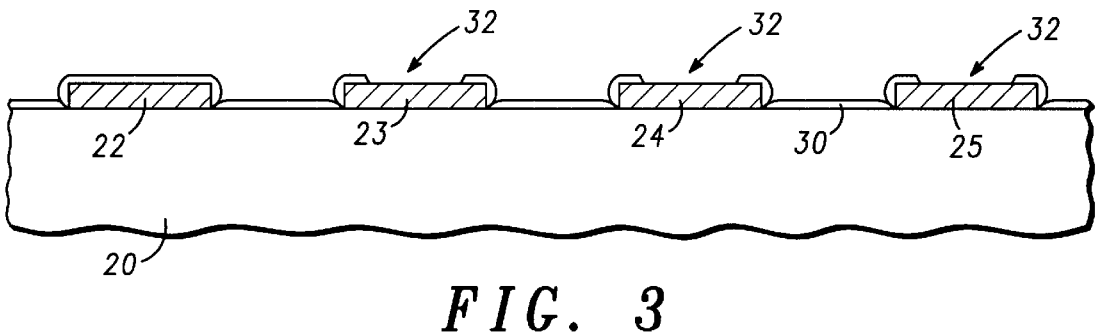
FIG. 3
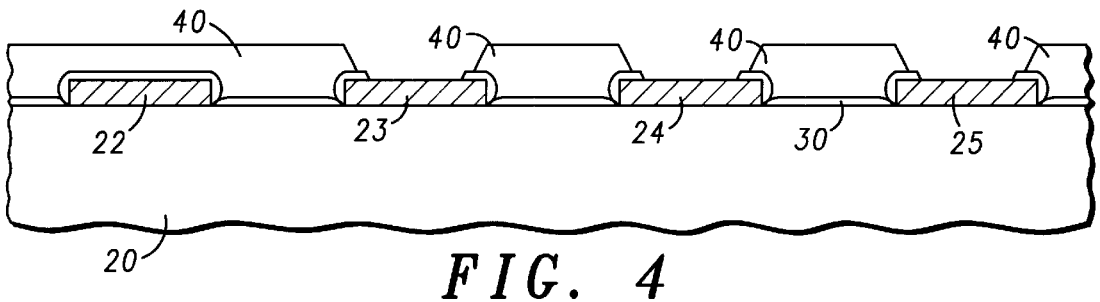
FIG. 4

SEMICONDUCTOR POWER DEVICE AND METHOD OF FORMATION

FIELD OF THE INVENTION

The present invention relates generally to semiconductor manufacturing, and more particularly to a MOS power device and its method of fabrication.

BACKGROUND OF THE INVENTION

One technique for fabricating high-power metal oxide semiconductor (MOS) devices uses a thick metallization (power metal) formed over the semiconductor device to provide current to the semiconductor device circuitry. Power metal has been effective in reducing on-resistance (Ron), eliminating non-uniform switching, increasing thermal capacity, forming spiral inductors, and improving the current carrying capacity and electromigration reliability of semiconductor devices.

FIG. 1 is an illustration of a prior art power metal structure that includes power metal structures 9A and 9B. The power structures 9A and 9B include a thick copper film 9, a seed layer 8, and an adhesion/barrier layer 7 formed over a passivation layer 6. The power metal structures 9A and 9B electrically connect to the semiconductor device through pad openings 10, 11, and 12 via interconnects 3, 4, and 5. As illustrated with respect to interconnect 2, which has no pad opening, not all interconnects electrically contact the power metal structures. Thus, portions of passivation layer 6 overlying interconnect 2 also function to electrically isolate the interconnect 2 from the power metal structure 9A.

However, residual film stress and coefficient of thermal expansion (CTE) differences between the passivation layer 6 and the power metal structure 9A can result in shear stress between the power metal structure 9A and passivation layer 6. A shear stress that exceeds fracture strength of the passivation layer 6 can produce cracks or defects X in the passivation layer 6, which can cause electrical shorting between the interconnect 2 and the power metal structure 9A. Under extreme conditions, the shear stress can also produce lateral shear of underlying interconnect 2. The shear stress results from contraction of power copper structures, as indicated by the vectors A1, A2, A3 and A4. The force of the stress is highest at the edge regions of the power metal structures 9A and 9B and decreases toward central regions of the power metal structures 9A and 9B. Some defects are detectable after reliability stressing and, depending on the defect's severity, may be detectable at burn-in or final test, in which case yield is impacted. If a defect goes undetected, it poses a risk as an in-the-field failure and becomes a reliability issue. One prior art method to reduce the power metal induced shear stress is to reduce the thickness of the power metal film. This, however, is undesirable because it can negate the previously discussed power metal's advantages.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which:

FIG. 1 is a cross-sectional view illustrating a prior power metal structure overlying a semiconductor device.

FIGS. 2–9 illustrate an embodiment of the present invention showing a power metal structure and its method of formation, wherein the power metal structure incorporates stress buffer features between the power metal structure and the underlying passivation layer.

Figure 5:
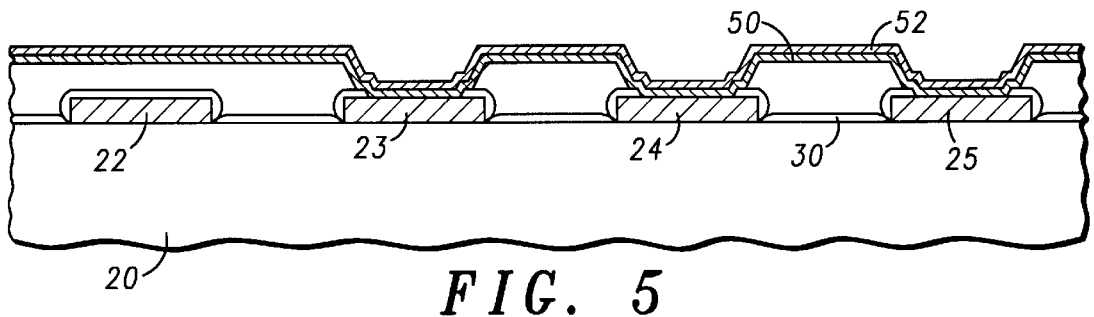

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention contemplates a method and structure for reducing defects associated with sheer stress induced by a power metal structure formed over a semiconductor device. Typically the power metal structure is formed using copper, nickel or gold. However, it may be formed using a variety of conductive materials known to one of ordinary skill in the art.

The present inventors recognized that shear stress created by power metal structures can affect yield and reliability of semiconductor device. Accordingly, in one embodiment, a polyimide feature is formed between the power metal structure and the passivation layer. The polyimide feature functions as a buffer to reduce shear stress between the two films. In an alternative embodiment, the power metal structure is designed with slits. The slits reduce the overall stress associated with a relatively large power metal structure by dividing it into smaller segments. Power metal structures with slits produce smaller peak stress in underlying films as compared to continuous power metal structures having a similar thickness.

Embodiments of the present invention will now be more fully discussed in reference to the accompanying figures. FIG. 2 illustrates a cross-sectional view of a partially fabricated semiconductor device 200. As illustrated in FIG. 2, semiconductor device 200 includes uppermost interconnects 22, 23, 24, and formed overlying a semiconductor device substrate 20. As used in this specification an uppermost interconnect level refers to an interconnect level formed prior to formation of the uppermost passivation level and after formation of underlying interlevel dielectric (ILD) layers, vias, and interconnects. Illustrative details with respect to semiconductor substrate 20 have been omitted for simplicity of the drawings. However, one of ordinary skill recognizes that the semiconductor substrate 20 can include one or more levels of ILDs, vias, and interconnects, as well as active and passive devices, such as transistors, memory cells, capacitors, resistors, and the like.

Shown in FIG. 3, a passivation layer 30 has been formed over the semiconductor device substrate. In one specific embodiment, the passivation layer 30 comprises a layer of chemically vapor deposited (CVD) silicon nitride overlying a layer of CVD phosphosilicate glass (PSG) overlying a plasma enhanced CVD silicon dioxide hard mask layer. The combined nitride and PSG layer thickness is in a range of approximately 300–900 nanometers and the thickness of the hardmask layer is in a range of 100–300 nanometers. The passivation layer 30 is patterned using conventional lithography and etched using conventional plasma or wet dielectric etch processes to define passivation openings 32 that expose portions of the interconnects 23, 24, and 25.

FIG. 4 further illustrates the semiconductor device substrate shown in FIG. 3, after depositing, patterning, and etching a polyimide layer to form stress buffer structures 40 on the passivation layer 30. In one embodiment, the polyimide layer is a 3–6 μm thick photo-imageable layer of polyimide coated using a conventional spin-on process. The polyimide layer has been developed or etched using conventional processing to define polyimide stress buffer features (stress buffers) 40. If necessary, the stress buffers 40 can be oven cured above 350 degrees Celsius to release volatile organic components and moisture. In addition, a plasma ash process can be utilized to remove organic residue from the exposed surface of the interconnects 23, 24, and 25 after forming the stress buffers 40.

The stress buffers 40 can be sized such that they do not physically contact interconnects 23, 24, and 25, thereby minimizing materials interactions. Alternatively, the stress buffers 40 can be sized such that they are formed on portions of interconnects 23, 24 and 25 so as to provide increased stress protection. In one embodiment, the stress buffer 40 is a continuous structure formed on the passivation layer. In alternative embodiments, the stress buffers 40 are formed only on specific regions of the passivation layer or as discrete patterns, such as "islands" or "bars" or any variety of shapes that may reduce stress or correspondingly insure reliable contact between the power metalstructure and interconnects. Additionally, the stress buffers 40 can be formed from a number of different materials instead of polyimide. For example, using other organic materials, such as benzocyclobutene (BCB) or polybenzoxazole (PBO).

The present inventors have recognized that the peak (maximum) shear stress in the passivation layer occurs at the edge regions of a power metal structure, and material failure and corresponding semiconductor device failure generally occurs in regions of maximum shear stress. The magnitude of the stress is impacted by the size (length, width and thickness) of the power metal structure. It is advantageous to form stress buffer structures 40 such that the edges of the power metal structure are on the stress buffer 40 so that the peak shear loads are acting on the polyimide and not the passivation. Passivation is relatively brittle and more likely to crack under stress as compared to plastic polyimide.

Shown in FIG. 5 is cross-sectional view of the semiconductor device substrate shown in FIG. 4, after forming an adhesion/barrier layer 50 and seed layer 52 on the exposed substrate surface. In one embodiment, the substrate is first sputter cleaned followed by the deposition of the adhesion/barrier layer 50 using a conventional sputtering deposition method. In one embodiment, the adhesion/barrier layer 50 is a layer of titanium tungsten having a thickness in a range of approximately 150–300 nm. In alternative embodiments, the adhesion barrier layer 50 can include titanium, titanium nitride, nickel vanadium, chromium, or combinations thereof. After depositing the adhesion/barrier layer 50, a seed layer 52 is deposited over the exposed substrate surface. In one embodiment, the seed layer 52 is a layer of sputter deposited copper having a thickness in a range of 450–600 nm. In alternative embodiments, other conductive metals, such as gold can be used to form the seed layer. Typically, the sputter preclean, the adhesion/barrier layer 50 deposition, and the seed layer 52 deposition are all sequentially deposited inside the same processing tool, although this is not necessarily a requirement of the present invention.

Depending on the period of time between the polyimide cure and adhesion/barrier layer and seed layer depositions or if necessary, a dehydration bake step can be incorporated to remove absorbed moisture from the stress buffers 40. Failure to adequately remove excess moisture from the polyimide may subsequently result in delamination of the power metal structure.

Figure 6:
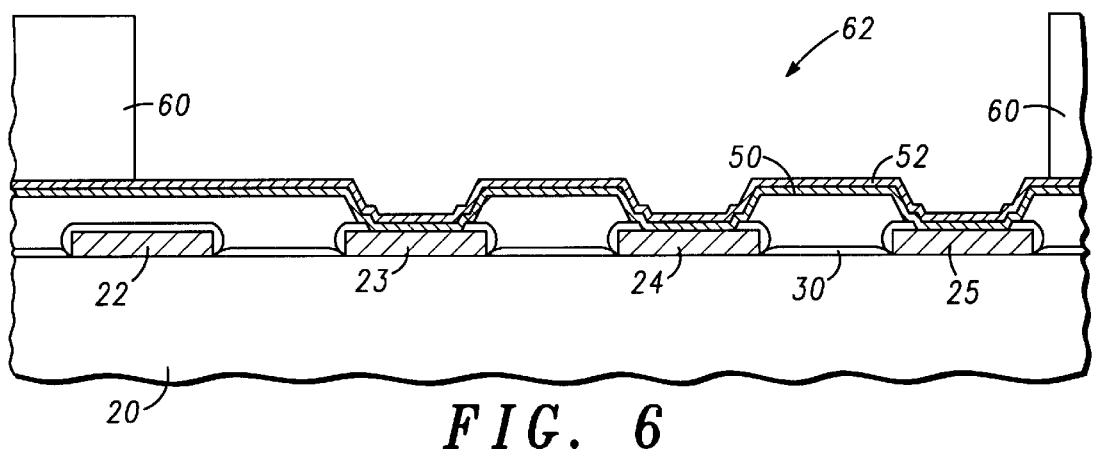

Shown in FIG. 6 is cross-sectional view of the semiconductor device substrate shown in FIG. 5 further illustrating the patterning of a resist layer 60 on the semiconductor substrate to define an opening 62. The resist layer 60 is thicker than a subsequently deposited power metal film thickness (typically, the power metal film thickness is in a range of 4–40 μm). The patterning process to define the opening 62 is conventional. For increasingly thick layers of resist, multiple resist coat and bake steps may be incorporated. As illustrated in FIG. 6, the opening 62 exposes portions of the seed layer 52.

Figure 7:
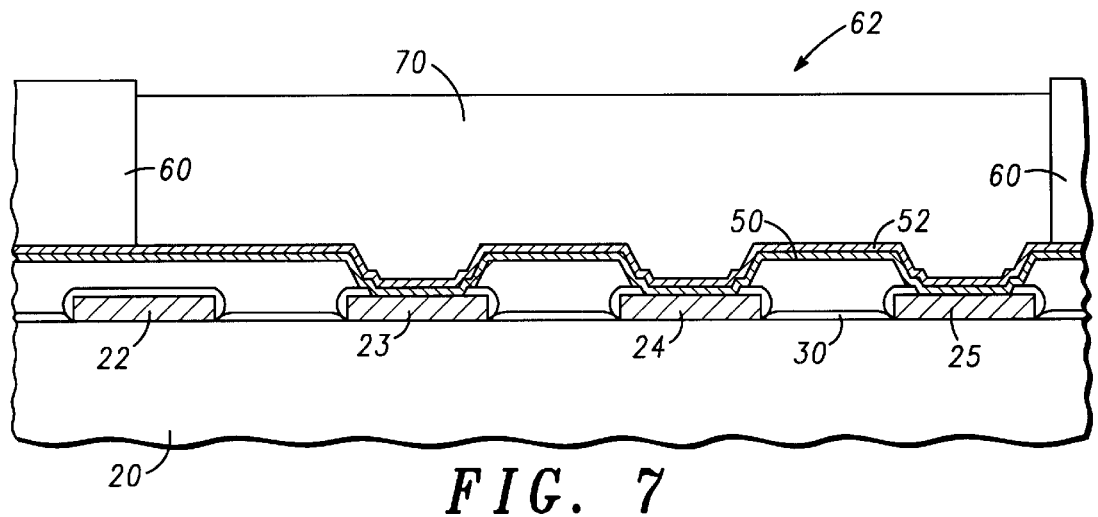

Shown in FIG. 7 is a cross-sectional view of the semiconductor device substrate shown in FIG. 6 after forming a conductive (power metal) film 70 within the opening 62. In one embodiment, the power metal film 70 is a copper film deposited using a conventional electroplating process. Alternatively, electroless plating may be used to deposit the power metal film 70. The power metal film 70 may alternatively be formed using gold, or may comprise alloying elements, such asmagnesium, indium, tin, chromium, zinc, carbon, zirconium, palladium, titanium, iron, niobium, magnesium, or the like. In yet another embodiment, the power metal film may include multiple layers of conductive materials, such as copper, nickel, gold or copper, nickel, palladium, or combinations thereof. In one specific embodiment, the power metal film 70 is a copper film having a thickness in a range of approximately 4–25 μm.

Figure 8:
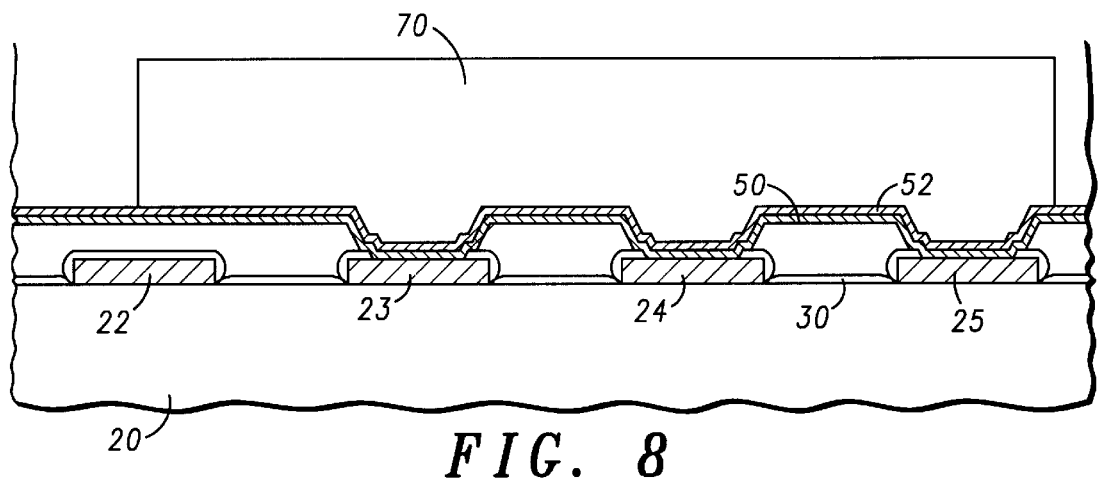

Shown in FIG. 8 is a cross-sectional view of the semiconductor device substrate shown in FIG. 7, after removing the patterned resist features 60. The patterned resist features 60 can be removed using conventional resist stripping processes. For example, using an oxygen-containing plasma ash process or a wet chemical process.

Figure 9:
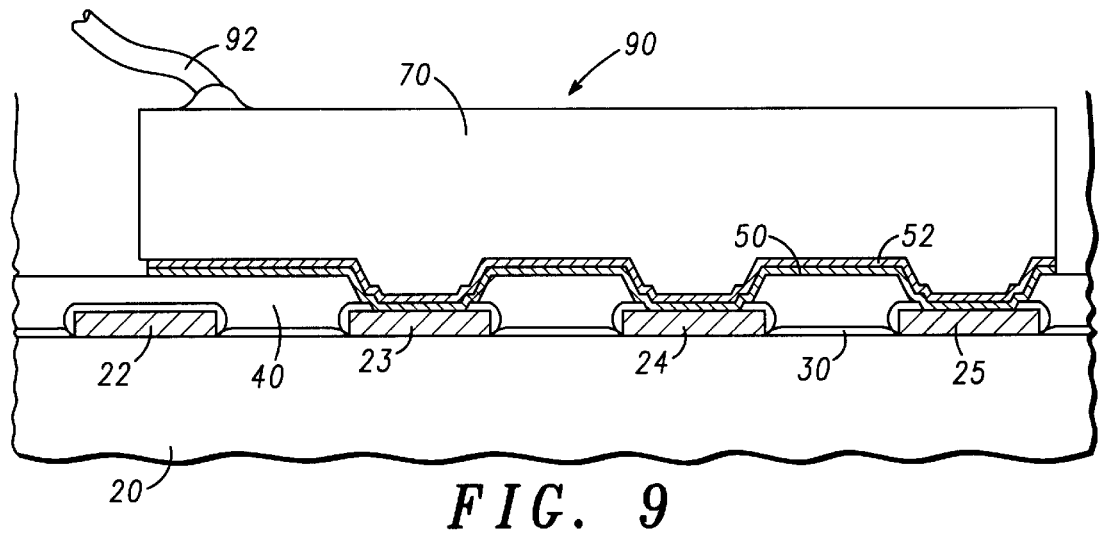

Shown in FIG. 9 is a cross-sectional view of the semiconductor device substrate shown in FIG. 8 after removing exposed remaining portions of seed layer 52 and adhesion/barrier layer 50 and forming the power metal structure 90. In one embodiment, Cu seed layer 52 is removed with a chlorite or persulfate copper etchant using a spray acid tool or, alternatively, in an agitated bath. Exposed portions of adhesion/barrier layer 50 can then be stripped using hot hydrogen peroxide. In alternative embodiments, a dilute sulfuric acid dip can be incorporated to remove residual surface copper oxide and an oxygen-containing ash processing step can be incorporated to clean exposed polyimide surfaces to reduce electrical leakage.

Power metal structure 90 used in conjunction with the stress buffers 40 are advantageous over prior art power metal structures for a number of reasons. First, the stress buffers 40 mitigate power metal structure shear stress effects on underlying passivation layer 30, interconnects 22–25, and semiconductor substrate 20. The reduction in shear stress correspondingly reduces stress induced defects, such as passivation layer cracking, as indicated by defect X in FIG. 1. The stress buffers 40 improve wafer yield and device reliability. by preventing electrical shorting between power metal structures and underlying interconnects. Additionally, the polyimide stress buffers 40 allow the layout design of active devices (not shown) to include locations under wirebond pad regions, as indicated by wirebond 92 on FIG. 9. The stress buffers 40 protect brittle underlying ILD layers from damaging effects of thermosonic wirebonding by providing a cushion between the power metal structures and passivation. An ability to design bond pads over active devices improves layout efficiency, reduces die cost, and further lowers device on-resistance.

The stress buffers 40 also planarize the surface topography, which can reduce formation of seed layer 50 metal stringer defects (shown as defect Y in FIG. 1). The stringer defects Y are the result of residual barrier metal layer 50 wedged in crevices of passivation layer 30. If the stringer defects Y are not completely removed during the barrier metal layer etch, they can produce electrical shorts between adjacent power metal structures. The stress buffers 40 cover and thereby prevent formation of the barrier metal layer 50 within the passivation layer crevices.

Figure 10:
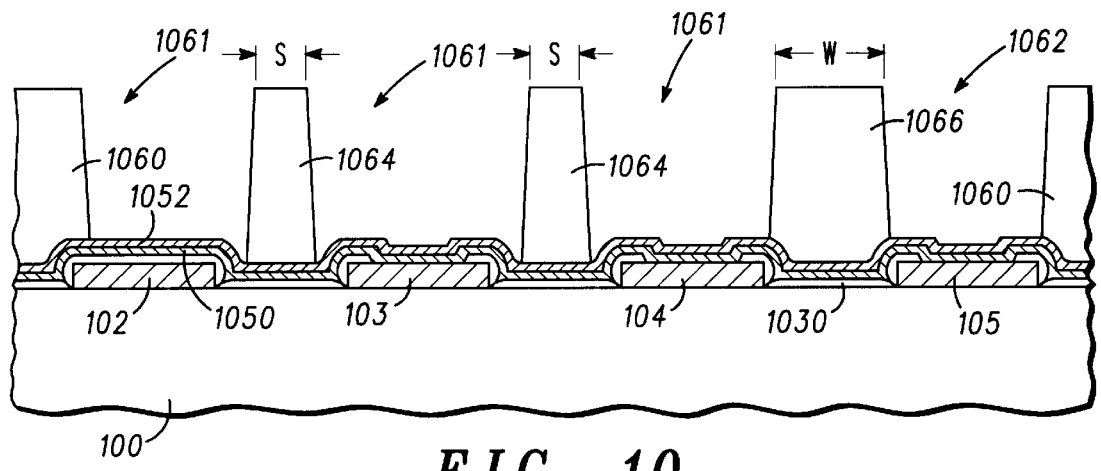
FIGS. 10–13 illustrate an alternative embodiment of the present invention showing a power metal structure and its method of formation, wherein the power metal structure incorporates design-in slits between adjacent segments of the power metal structure.

FIGS. 10–13 illustrate an alternative embodiment of the present invention. The power metal structure's stress is reduced by partitioning power metal structure into segments wherein electrical continuity between each segments is provided by unremoved portions of the seed and barrier layers. FIG. 10 is a cross-sectional view that includes substrate 100, interconnects 102, 103, 104, and 105, passivation layer 1030, adhesion/barrier layer 1050 and seed layer 1052, which are similar to those described previously with respect to substrate 20, interconnects 22–25, passivation layer 30, adhesion/barrier layer 50, and seed layer 52 and of FIGS. 2–9.

As shown in FIG. 10, the adhesion/barrier layer 1050 is deposited overlying the passivation layer 1030 and interconnects 102–105 and the seed layer is deposited overlying the adhesion/barrier layer 1050. Then, after depositing seed layer 1052, the substrate is patterned to form resist features 1060, 1064, and 1066. The resist features are formed using materials and processes similar to those used to form resist features 60 described previously with respect to FIG. 6. The resist features 1064 will partition a subsequently deposited power metal structure into three smaller segments defined by the openings 1061. The resist feature 1066 will separate the subsequently deposited segmented power metal structure from an adjacent power metal structure.

Figure 11:
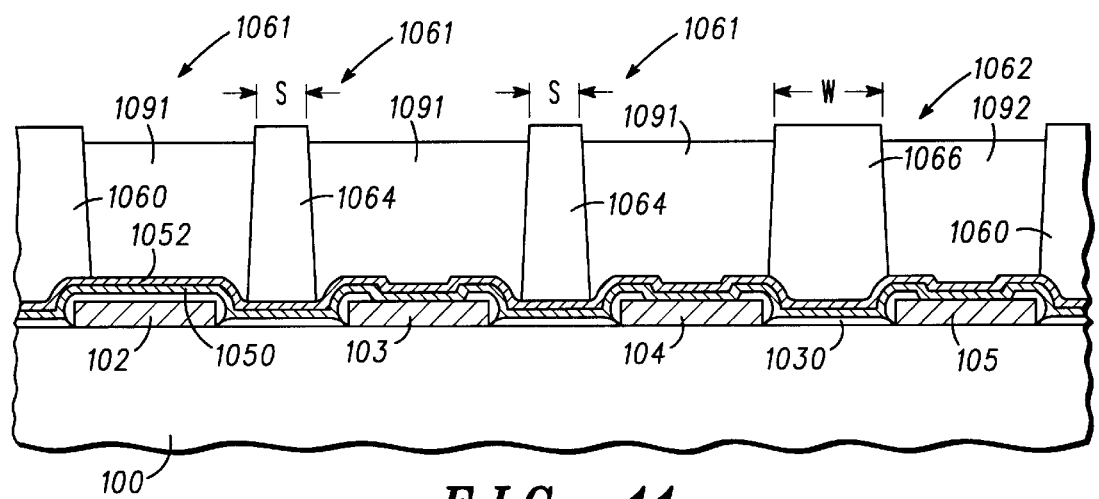
Figure 12:
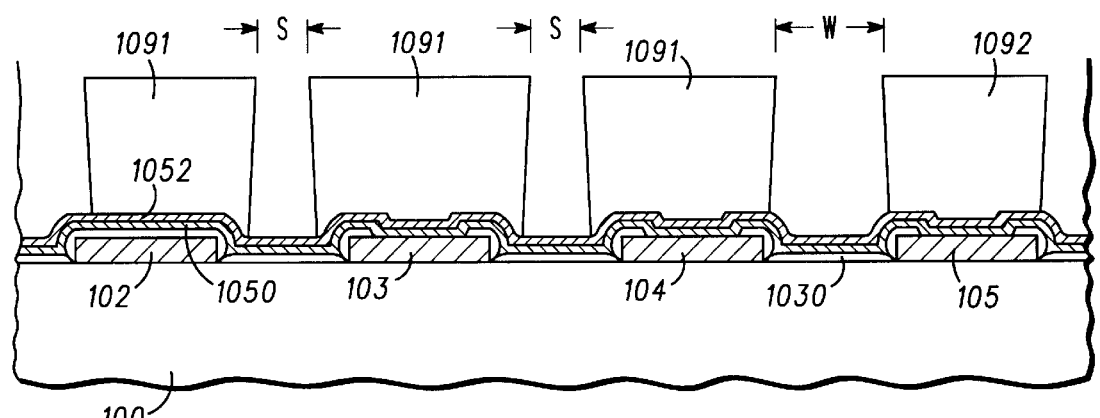

Referring now to FIG. 11, a conductive film is deposited within the openings 1061 and 1062, thereby forming conductive structures 1091 and 1092. The structures 1091 and 1092 can be formed using processes and materials similar to those used to form the power metal film 70 discussed previously with respect to FIG. 7. In FIG. 12, the resist layers 1060, 1064 and 1066 are removed to expose portions of the seed layer 1052. Removal is accomplished using processes similar to those described to remove resist layer 60 discussed previously with respect to FIG. 8.

Figure 13:
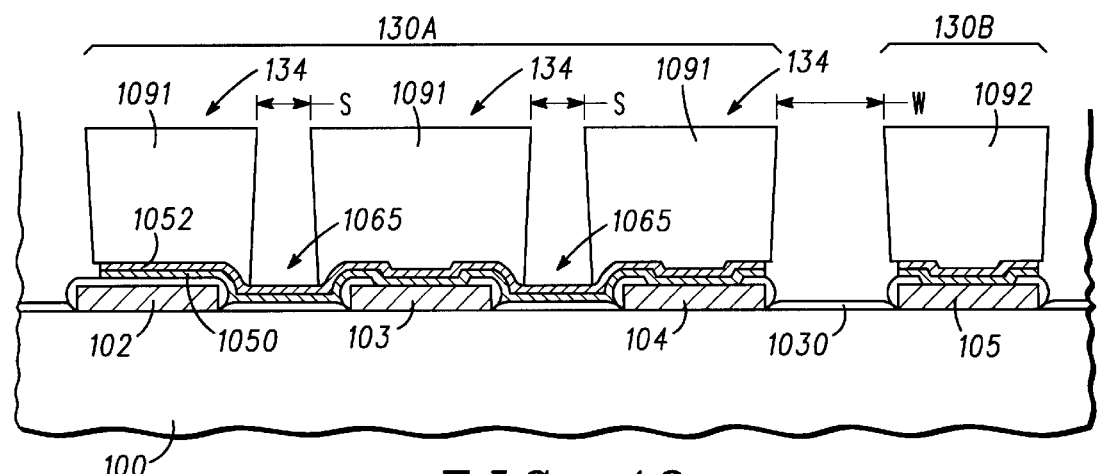

Referring now to FIG. 13, selected remaining exposed seed layer 1052 portions and adhesion/barrier layer 1050 portions are removed using processes and chemicals described previously to remove exposed seed layer 52 portions and adhesion/barrier layer 50 portions in FIG. 9. However, unlike the prior art, the present embodiment advantageously uses the etchant's wetting properties or macroloading effects to remove only seed layer 1052 and adhesion/barrier layer 1050 portions between conductive members spaced apart by at least a minimum distance W. The minimum distance W is defined as the distance between adjacent conductive structures, wherein an etchant is capable of removing seed layer 1052 and adhesion/barrier layer 1050 portions to electrically isolate two power metal structures. In the present embodiment, only seed metal layer 1052 and adhesion/barrier layer 1050 portions between the adjacent conductive structures 1092 and 1091 are removed. As shown in FIG. 13, removal of the portions of seed metal layer 1052 and adhesion/barrier layer 1050 between the adjacent conductive structures 1092 and 1091 defines the power metal structures 130A and 130B.

The power metal structure 130A, however, is further segmented into conductive structures 1091 that are separated by a distance S that is less than the minimum distance W. In those regions where the conductive structures are separated by the distance S, the etchant is incapable of substantially removing the corresponding seed layer 1052 and adhesion/barrier layer 1050 portions. Consequently, electrical continuity between the conductive structures 1091 is maintained.

In one embodiment, the selective etching of one region and not another occurs as a result of using a wet etch process. Where the distance between conductive structures is W or greater, i.e., between 1091 and 1092, etchant can flow into the cavity between the conductive structures, wet the exposed seed layer 1052 surface, and etch the exposed seed layer 1052 and adhesion/barrier layer 1050 to define separate power metal structures 130A and 130B. However, as shown in FIG. 13, where the distance between conductive structures is a distance less than W, for example the distance S between adjacent conductive structures 1091, the etchant does not sufficiently flow into the cavity to wet the exposed seed layer 1052 and adhesion/barrier layer 1050. Thus, in the regions 1065 the seed layer 1052 and barrier layer 1050 remain substantially intact. These remaining seed layer 1052 and barrier layer 1050 portions electrically interconnect the conductive structures 1091. The combination of the remaining seed layer 1052 and adhesion/barrier layer 1050 portions (interconnecting conductive members) in regions 1065 and conductive structures 1091 define the segmented power metal structure 130A (conductive feature) that comprises power metal segments 134.

The power metal structure 130A is advantageous over the prior art power metal structure 9A of FIG. 1, because the magnitude of the peak shear stress in underlying films and interconnects is reduced by the design of slits between the power metal segments 134. Therefore, unlike the prior art power metal structure 9A, which is one physically continuous power bus, the present embodiment contemplates a structure and method of formation by which an electrically continuous power metal bus is partitioned into smaller interconnected segments. Accordingly, the magnitude of peak shear stress imparted to underlying films by segmented power metal bus is less than magnitude of peak shear stress associated with one continuous power metal structure, particularly toward the edge regions of the power metal structure. The magnitude of peak shear stress can be reduced such that defect X as shown on FIG. 1 does not occur Unlike the previous embodiment which mitigates the shear stress effects of the power metal structures by providing an intervening stress buffer between the passivation and power metal structure, this embodiment advantageously reduces the peak shear stress associated with the power metal structure 9A by dividing it into small electrically connected segments 130A. In addition, the present embodiment is advantageous in that it can be incorporated without requiring the use of additional or elaborate processing steps. And, using segmented power metal structures can also reduce problems with wafer bow that can be encountered when increasing the thickness of power metal structure.

Figure 14:
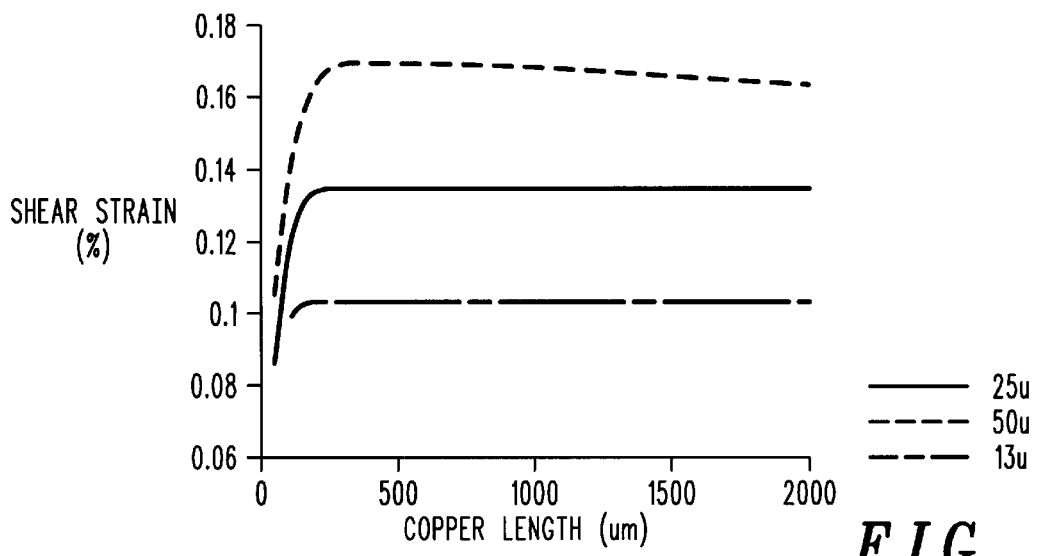
FIGS. 14 and 15 are numerical simulation graphs illustrating the relationship between shear strain and length or copper power metal structures having thicknesses of approximately 13, 25, and 50 microns.
Figure 15:
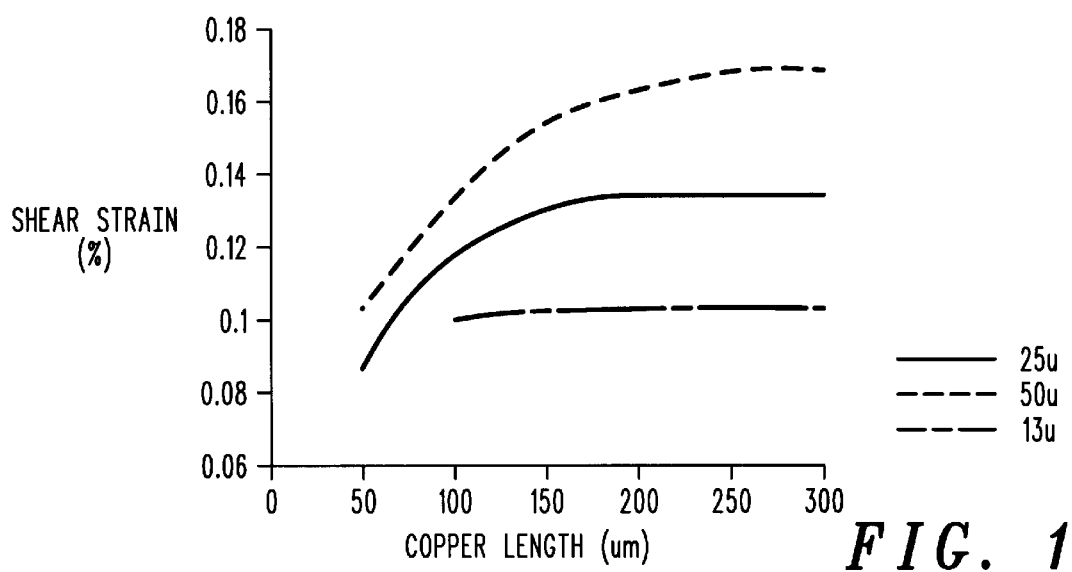

Shown in FIGS. 14 and 15 are numerical simulation graphs illustrating the relationship between shear strain and length (or width) of copper power metal structures having thicknesses of approximately 13, 25, and 50 microns. As shown in FIGS. 14 and 15, the shear strain imparted by the 13 micron thick power metal structure is relatively insensitive to length, and the shear strain imparted by the 25 and 50 micron thick power metal structures increases until the length of the power metal structure reaches approximately 250 microns, after which it stabilizes. As illustrated in FIG. 15, a 25 micron thick copper power metal structure (corresponding to a segment portion 134 shown in FIG. 13) having a length of approximately 70 microns imparts approximately the same amount of shear stress as a 13 micron thick copper power metal structure. Similarly, a 50 microns thick copper power metal structure (corresponding to a segment portion 134 shown in FIG. 13) having a length of approximately 50 microns imparts approximately the same amount of shear stress as the 13 micron thick copper power metal structure. Accordingly, one of ordinary skill in the art recognizes segmentation may be most effective for power metal structures having lengths, widths, and thicknesses that fall within a specific ranges of dimensions and that the segmented power metal structure can be designed to achieve optimum results.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:

forming a first interconnect and a second interconnect over a semiconductor device substrate;

forming a passivation layer over the first and second interconnect;

forming openings through the passivation layer, wherein a first opening exposes a portion of the first interconnect and a second opening exposes a portion of the second interconnect;

forming a stress buffer feature over portions of the passivation layer; and forming a conductive structure over a portion of the stress buffer feature, wherein the conductive structure is electrically coupled to the first interconnect through the first opening and the second interconnect through the second opening.

2. The method of claim 1, wherein the stress buffer feature comprises polyimide.

3. The method of claim 1, wherein an edge region of the conductive structure overlies and contacts a stress buffer feature.

4. The method of claim 1, wherein the conductive structure is further characterized as a power metal structure.

5. The method of claim 4, wherein the power metal structure includes a material selected from the group consisting of copper, nickel, and gold.

6. A method for forming a semiconductor device comprising:

forming a first interconnect and a second interconnect overlying a semiconductor device substrate;

forming a passivation layer over the first interconnect and the second interconnect;

patterning the passivation layer to define a first pad opening that exposes portions of the first interconnect and a second pad opening that exposes portions of the second interconnect;

forming a conductive member over the passivation layer; and forming a first conductive structure and a second conductive structure on the conductive member, wherein the first conductive structure is physically spaced apart from the second conductive structure and, wherein the first conductive structure is electrically coupled to the second conductive structure by way of the conductive member, wherein a combination of the first conductive structure, the second conductive structure, and conductive member defines a conductive feature that electrically couples the first interconnect and the second interconnect.

7. The method of claim 6, further comprising:

sputter depositing the conductive member; and electroplating the first conductive structure and the second conductive structure.

8. The method of claim 7, wherein the conductive member is further characterized as including remaining portions of an adhesion/barrier layer and the first conductive structure and the second conductive structure are further characterized as power metal segments.

9. The method of claim 6, wherein the conductive feature is further characterized as a segmented power metal structure.

10. The method of claim 9 wherein the first conductive structure and the second conductive structure include a metal selected from a group consisting of copper, nickel, and gold.

* * * * *

UNITED STATES PATENT AND TRADEMARK OFFICE
CERTIFICATE OF CORRECTION

PATENT NO. : 6,646,347 B2
DATED : November 11, 2003
INVENTOR(S) : Mercado et al.

It is certified that error appears in the above-identified patent and that said Letters Patent is hereby corrected as shown below:

Column 7,
Line 40, replace the entire claim 1 with:
-- A method for forming a semiconductor device comprising:
forming a first interconnect and a second interconnect of a common interconnect layer over a semiconductor device substrate;
forming a passivation layer over the first and second interconnect;
forming openings through the passivation layer, wherein a first opening exposes a portion of the first interconnect and a second opening exposes a portion of the second interconnect; forming a stress buffer feature over portions of the passivation layer; and forming a conductive structure over a portion of the stress buffer feature, wherein the conductive structure is electrically coupled to the first interconnect through the first opening and the second interconnect through the second opening and further wherein at least one edge of the conductive structure overlies and contacts a portion of the stress buffer featrue. --

Column 8,
Line 4, replace the entire claim 2 with:
-- The method of claim 1, wherein the stress buffer feature comprises a patterned polyimide film having a thickness in excess of 3 microns. --
Line 14, replace the entire claim 6 with:
-- A method for forming a semiconductor device comprising:
forming a first interconnect and a common interconnect of a common interconnect layer overlying a simiconductor device substrate;
forming a passivation layer over the first interconnect and the second interconnect;
patterning the passivation layer to define a first pad opening that exposes portions of the first interconnect and a second pad opening that exposes portions of the second interconnect;
forming a conductive member over the passivation layer; and
forming a partitioned conductive feature comprising a first conductive structure and a second conductive structure simultaneously deposited on the conductive member, wherein the first conductive structure is physically separated form the second conductive structure by a distance S where S is less than a predetermined distance W and, wherein the first conductive structure is electrically coupled to the second conductive structure by way of the conductive member, wherein a combination of the first conductive structure, the second conductive structure, and conductive member defines a partitioned conductive feature that electrically couples the first interconnect and the second interconnect. --

UNITED STATES PATENT AND TRADEMARK OFFICE
CERTIFICATE OF CORRECTION

PATENT NO. : 6,646,347 B2
DATED : November 11, 2003
INVENTOR(S) : Mercado et al.

It is certified that error appears in the above-identified patent and that said Letters Patent is hereby corrected as shown below:

Column 8, (continued)
Line 47, replace the entire claim 9 with:
-- The method of claim 6, wherein the distance W defines a minimum gap between adjacent conductive structures into which an etchant of the conductive member can flow. --

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO.     : 6,646,347 B2
DATED          : November 11, 2003
INVENTOR(S)    : Mercado et al.

It is certified that error appears in the above-identified patent and that said Letters Patent is hereby corrected as shown below:

Column 7,
Line 40, replace the entire claim 1 with:
-- A method for forming a semiconductor device comprising:
forming a first interconnect and a second interconnect of a common interconnect layer over a semiconductor device substrate;
forming a passivation layer over the first and second interconnect;
forming openings through the passivation layer, wherein a first opening exposes a portion of the first interconnect and a second opening exposes a portion of the second interconnect; forming a stress buffer feature over portions of the passivation layer; and forming a conductive structure over a portion of the stress buffer feature, wherein the conductive structure is electrically coupled to the first interconnect through the first opening and the second interconnect through the second opening and further wherein at least one edge of the conductive structure overlies and contacts a portion of the stress buffer featrue. --

Column 8,
Line 4, replace the entire claim 2 with:
-- The method of claim 1, wherein the stress buffer feature comprises a patterned polyimide film having a thickness in excess of 3 microns. --
Line 14, replace the entire claim 6 with:
-- A method for forming a semiconductor device comprising:
forming a first interconnect and a second interconnect of a common interconnect layer overlying a semiconductor device substrate;
forming a passivation layer over the first interconnect and the second interconnect;
patterning the passivation layer to define a first pad opening that exposes portions of the first interconnect and a second pad opening that exposes portions of the second interconnect;
forming a conductive member over the passivation layer; and
forming a partitioned conductive feature comprising a first conductive structure and a second conductive structure simultaneously deposited on the conductive member, wherein the first conductive structure is physically separated from the second conductive structure by a distance S where S is less than a predetermined distance W and, wherein the first conductive structure is electrically coupled to the second conductive structure by way of the conductive member, wherein a combination of the first conductive structure, the second conductive structure, and conductive member defines a partitioned conductive feature that electrically couples the first interconnect and the second interconnect. --

UNITED STATES PATENT AND TRADEMARK OFFICE
CERTIFICATE OF CORRECTION

PATENT NO. : 6,646,347 B2
DATED : November 11, 2003
INVENTOR(S) : Mercado et al.

It is certified that error appears in the above-identified patent and that said Letters Patent is hereby corrected as shown below:

<u>Column 8, (continued)</u>
Line 47, replace the entire claim 9 with:
-- The method of claim 6, wherein the distance W defines a minimum gap between adjacent conductive structures into which an etchant of the conductive member can flow. --

Signed and Sealed this

Twenty-ninth Day of March, 2005

JON W. DUDAS
*Director of the United States Patent and Trademark Office*